United States Patent
Bristol et al.

(10) Patent No.: US 9,793,163 B2
(45) Date of Patent: *Oct. 17, 2017

(54) SUBTRACTIVE SELF-ALIGNED VIA AND PLUG PATTERNING FOR BACK END OF LINE (BEOL) INTERCONNECTS

(71) Applicant: Intel Corporation, Santa Clara, CA (US)

(72) Inventors: Robert L. Bristol, Portland, OR (US); Florian Gstrein, Portland, OR (US); Richard E. Schenker, Portland, OR (US); Paul A. Nyhus, Portland, OR (US); Charles H. Wallace, Portland, OR (US); Hui Jae Yoo, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/912,036

(22) PCT Filed: Sep. 27, 2013

(86) PCT No.: PCT/US2013/062319
§ 371 (c)(1),
(2) Date: Feb. 12, 2016

(87) PCT Pub. No.: WO2015/047318
PCT Pub. Date: Apr. 2, 2015

(65) Prior Publication Data
US 2016/0197011 A1    Jul. 7, 2016

(51) Int. Cl.
*H01L 21/768* (2006.01)
*H01L 21/311* (2006.01)
(Continued)

(52) U.S. Cl.
CPC .. *H01L 21/76897* (2013.01); *H01L 21/31144* (2013.01); *H01L 21/76808* (2013.01);
(Continued)

(58) Field of Classification Search
CPC ......... H01L 21/76897; H01L 21/76825; H01L 23/5226; H01L 23/528; H01L 21/31144;
(Continued)

(56) References Cited

U.S. PATENT DOCUMENTS 9,236,342 B2 *   1/2016   Bristol ................. H01L 23/522
9,406,512 B2 *   8/2016   Bristol ................. H01L 23/528
(Continued)

FOREIGN PATENT DOCUMENTS

TW             483069          4/2002

OTHER PUBLICATIONS

International Search Report and Written Opinion from PCT/US2013/062319 mailed Jun. 25, 2014, 16 pgs.
(Continued)

*Primary Examiner* — Caleen Sullivan
(74) *Attorney, Agent, or Firm* — Schwabe, Williamson & Wyatt P.C.

(57) ABSTRACT

Subtractive self-aligned via and plug patterning for back end of line (BEOL) interconnects is described. In an example, an interconnect structure for an integrated circuit includes a first layer of the interconnect structure disposed above a substrate. The first layer includes a first grating of alternating metal lines and dielectric lines in a first direction. The dielectric lines have an uppermost surface higher than an uppermost surface of the metal lines. The interconnect structure further includes a second layer of the interconnect structure disposed above the first layer of the interconnect structure. The second layer includes a second grating of alternating metal lines and dielectric lines in a second
(Continued)

direction, perpendicular to the first direction. The dielectric lines have a lowermost surface lower than a lowermost surface of the metal lines. The dielectric lines of the second grating overlap and contact, but are distinct from, the dielectric lines of the first grating. The metal lines of the first grating are spaced apart from the metal lines of the second grating.

11 Claims, 12 Drawing Sheets

(51) Int. Cl.
*H01L 23/522* (2006.01)
*H01L 23/528* (2006.01)

(52) U.S. Cl.
CPC .. *H01L 21/76811* (2013.01); *H01L 21/76816* (2013.01); *H01L 21/76825* (2013.01); *H01L 23/528* (2013.01); *H01L 23/5226* (2013.01); *H01L 2924/0002* (2013.01)

(58) Field of Classification Search
CPC ......... H01L 21/76808; H01L 21/76811; H01L 21/76816; H01L 2924/0002; H01L 2924/00; H01L 21/76801; H01L 21/28562; H01L 21/76879; H01L 21/28506; H01L 21/76838; H01L 21/76849; H01L 21/4846; H01L 21/486; H01L 21/764; H01L 21/76802; H01L 21/76807; H01L 21/76829; H01L 21/28556; C23C 16/18; C23C 16/45525; C23C 16/45553; C23C 16/482
USPC .................................. 257/760; 438/624, 671
See application file for complete search history.

(56) References Cited

U.S. PATENT DOCUMENTS

| | | |
|---|---|---|
| 2005/0233503 A1 | 10/2005 | Leib et al. |
| 2009/0032967 A1 | 2/2009 | Becker et al. |
| 2010/0032846 A1 | 2/2010 | Chidambarrao et al. |
| 2012/0175626 A1 | 7/2012 | Erickson et al. |
| 2012/0313251 A1 | 12/2012 | Kato |
| 2013/0252420 A1 | 9/2013 | Sandhu |

OTHER PUBLICATIONS

Non-Final Office Action for Taiwan Patent Application No. 103132260 Mailed Dec. 29, 2015, 5 pgs.
Office Action for Vietnam Patent Application No. 1201600569, mailed Aug. 25, 2016, 2 pgs.
International Preliminary Report on Patentability for PCT Patent Application No. PCT/US2013/062319 mailed Apr. 7, 2016, 8 pgs.
European Extended Search Report for European Patent Application No. 13894766.8 dated Jun. 27, 2017, 5 pgs.

\* cited by examiner

SUBTRACTIVE SELF-ALIGNED VIA AND PLUG PATTERNING FOR BACK END OF LINE (BEOL) INTERCONNECTS

CLAIM OF PRIORITY

This application is a U.S. National Phase application under 35 U.S.C. §371 of International Application No. PCT/US2013/062319, filed Sep. 27, 2013, entitled "SUBTRACTIVE SELF-ALIGNED VIA AND PLUG PATTERNING FOR BACK END OF LINE (BEOL) INTERCONNECTS" the entire contents of which are incorporated herein by reference.

TECHNICAL FIELD

Embodiments of the invention are in the field of semiconductor structures and processing and, in particular, self-aligned via and plug patterning for back end of line (BEOL) interconnects.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

Integrated circuits commonly include electrically conductive microelectronic structures, which are known in the arts as vias, to electrically connect metal lines or other interconnects above the vias to metal lines or other interconnects below the vias. Vias are typically formed by a lithographic process. Representatively, a photoresist layer may be spin coated over a dielectric layer, the photoresist layer may be exposed to patterned actinic radiation through a patterned mask, and then the exposed layer may be developed in order to form an opening in the photoresist layer. Next, an opening for the via may be etched in the dielectric layer by using the opening in the photoresist layer as an etch mask. This opening is referred to as a via opening. Finally, the via opening may be filled with one or more metals or other conductive materials to form the via.

In the past, the sizes and the spacing of vias has progressively decreased, and it is expected that in the future the sizes and the spacing of the vias will continue to progressively decrease, for at least some types of integrated circuits (e.g., advanced microprocessors, chipset components, graphics chips, etc.). One measure of the size of the vias is the critical dimension of the via opening. One measure of the spacing of the vias is the via pitch. Via pitch represents the center-to-center distance between the closest adjacent vias.

When patterning extremely small vias with extremely small pitches by such lithographic processes, several challenges present themselves, especially when the pitches are around 70 nanometers (nm) or less and/or when the critical dimensions of the via openings are around 35 nm or less. One such challenge is that the overlay between the vias and the overlying interconnects, and the overlay between the vias and the underlying landing interconnects, generally need to be controlled to high tolerances on the order of a quarter of the via pitch. As via pitches scale ever smaller over time, the overlay tolerances tend to scale with them at an even greater rate than lithographic equipment is able to keep up.

Another such challenge is that the critical dimensions of the via openings generally tend to scale faster than the resolution capabilities of the lithographic scanners. Shrink technologies exist to shrink the critical dimensions of the via openings. However, the shrink amount tends to be limited by the minimum via pitch, as well as by the ability of the shrink process to be sufficiently optical proximity correction (OPC) neutral, and to not significantly compromise line width roughness (LWR) and/or critical dimension uniformity (CDU).

Yet another such challenge is that the LWR and/or CDU characteristics of photoresists generally need to improve as the critical dimensions of the via openings decrease in order to maintain the same overall fraction of the critical dimension budget. However, currently the LWR and/or CDU characteristics of most photoresists are not improving as rapidly as the critical dimensions of the via openings are decreasing.

A further such challenge is that the extremely small via pitches generally tend to be below the resolution capabilities of even extreme ultraviolet (EUV) lithographic scanners. As a result, commonly two, three, or more different lithographic masks may be used, which tend to increase the costs. At some point, if pitches continue to decrease, it may not be possible, even with multiple masks, to print via openings for these extremely small pitches using EUV scanners.

Thus, improvements are needed in the area of via manufacturing technologies.

BRIEF DESCRIPTION OF THE DRAWINGS

FIG. 1A illustrates a starting point structure for a subtractive via and plug process following deep metal line fabrication;

FIG. 1N illustrates the structure of FIG. 1M following metal line and via formation.

FIG. 2A illustrates a plan view and corresponding cross-sectional views of a starting plug grid;

FIG. 2B illustrates a plan view and corresponding cross-sectional views of the structure of FIG. 2A following photobucket fill, exposure and development;

FIG. 2C illustrates a plan view and corresponding cross-sectional views of the structure of FIG. 2B following plug formation; and FIG. 2D illustrates a plan view and corresponding cross-sectional views of the structure of FIG. 2C following removal of a hardmask layer and the remaining photobuckets.

DESCRIPTION OF THE EMBODIMENTS

Figure 1A:
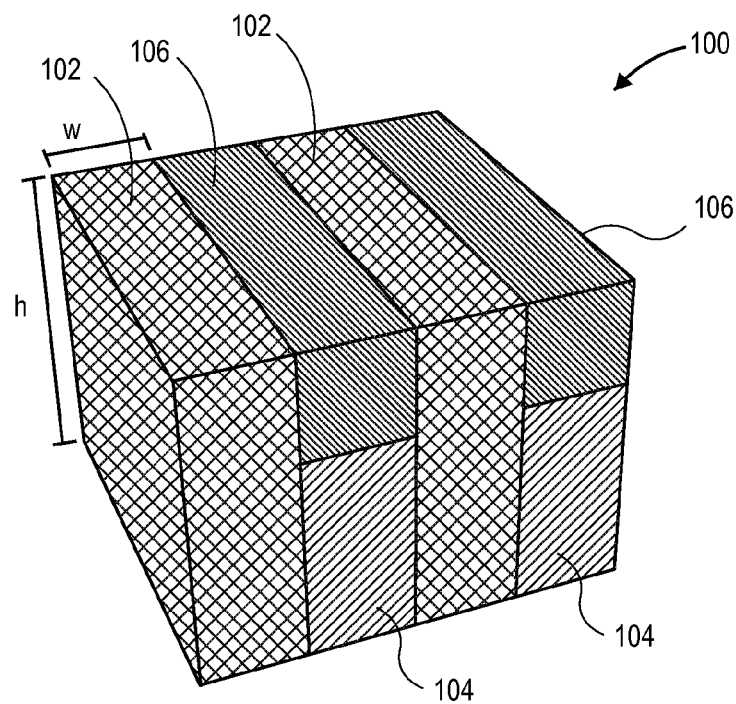
FIGS. 1A-1N illustrate portions of integrated circuit layers representing various operations in a method of subtractive self-aligned via and plug patterning, in accordance with an embodiment of the present invention, where.

Subtractive self-aligned via and plug patterning for back end of line (BEOL) interconnects is described. In the following description, numerous specific details are set forth, such as specific integration and material regimes, in order to provide a thorough understanding of embodiments of the present invention. It will be apparent to one skilled in the art that embodiments of the present invention may be practiced without these specific details. In other instances, well-known features, such as integrated circuit design layouts, are not described in detail in order to not unnecessarily obscure embodiments of the present invention. Furthermore, it is to be understood that the various embodiments shown in the Figures are illustrative representations and are not necessarily drawn to scale.

One or more embodiments described herein are directed to subtractive approaches for self-aligned via and plug patterning, and structure resulting there from. In an embodiment, processes described herein enable realization of self-aligned metallization for back-end of line feature fabrication. Overlay problems anticipated for next generation via and plug patterning may be addressed by one or more approaches described herein.

To provide context, current fabrication techniques for vias involves a "blind" process in which a via opening is patterned in a stack far above an ILD trench. The via opening pattern is then etched deep down into the trench. Overlay errors accumulate and can cause various problems, e.g., shorts to neighboring metal lines. In an example, patterning and aligning of features at less than approximately 50 nanometer pitch requires many reticles and critical alignment strategies that are otherwise extremely expensive for a semiconductor manufacturing process. In an embodiment, by contrast, approaches described herein enable fabrication of self-aligned plugs and/or vias, greatly simplifying the web of overlay errors, and leaving only one critical overlay step (Mx+1 grating).

In general, one or more embodiment described herein involves the use of a subtractive method to pre-form every via and plug using the trenches already etched. An additional operation is then used to select which of the vias and plugs to retain. Such operations can be illustrated using "photo-buckets," although the selection process may also be performed using a more conventional resist expose and ILD backfill approach.

More specifically, one or more embodiments are directed to an approach that employs a subtractive technique to form conductive vias and non-conductive spaces or interruptions between metals (referred to as "plugs"). Vias, by definition, are used to land on a previous layer metal pattern. In this vein, embodiments described herein enable a more robust interconnect fabrication scheme since alignment by lithography equipment is no longer relied on. Such an interconnect fabrication scheme can be used to save numerous alignment/exposures, can be used to improve electrical contact (e.g., by reducing via resistance), and can be used to reduce total process operations and processing time otherwise required for patterning such features using conventional approaches.

Figure 1B:
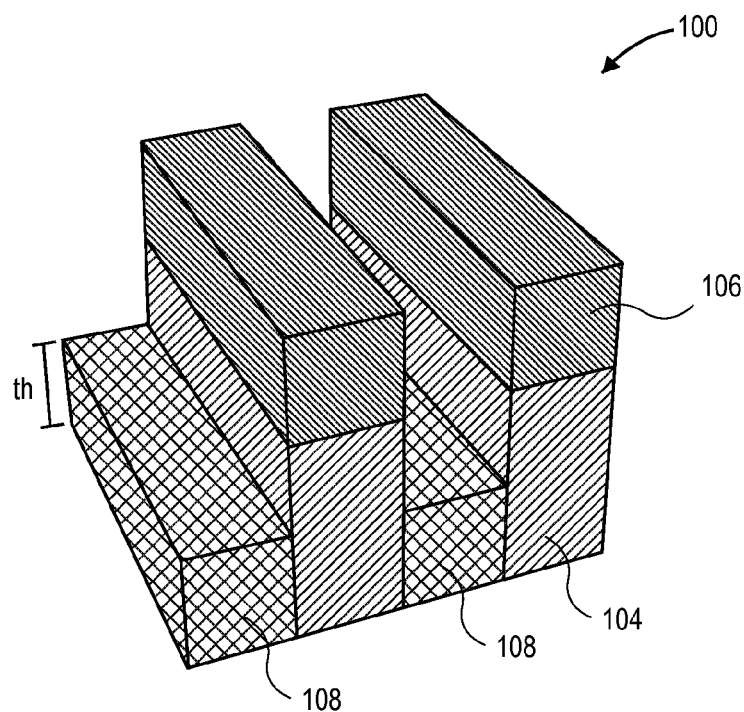
FIG. 1B illustrates the structure of FIG. 1A following recessing of the metal lines.
Figure 1C:
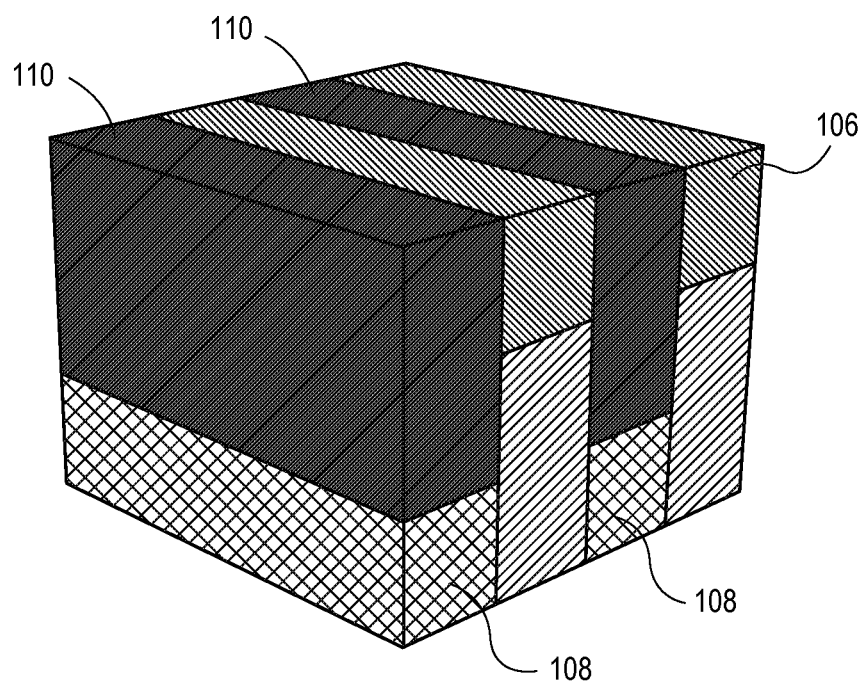
FIG. 1C illustrates the structure of FIG. 1B following hardmask fill in the recessed regions of the recessed metal lines.
Figure 1D:
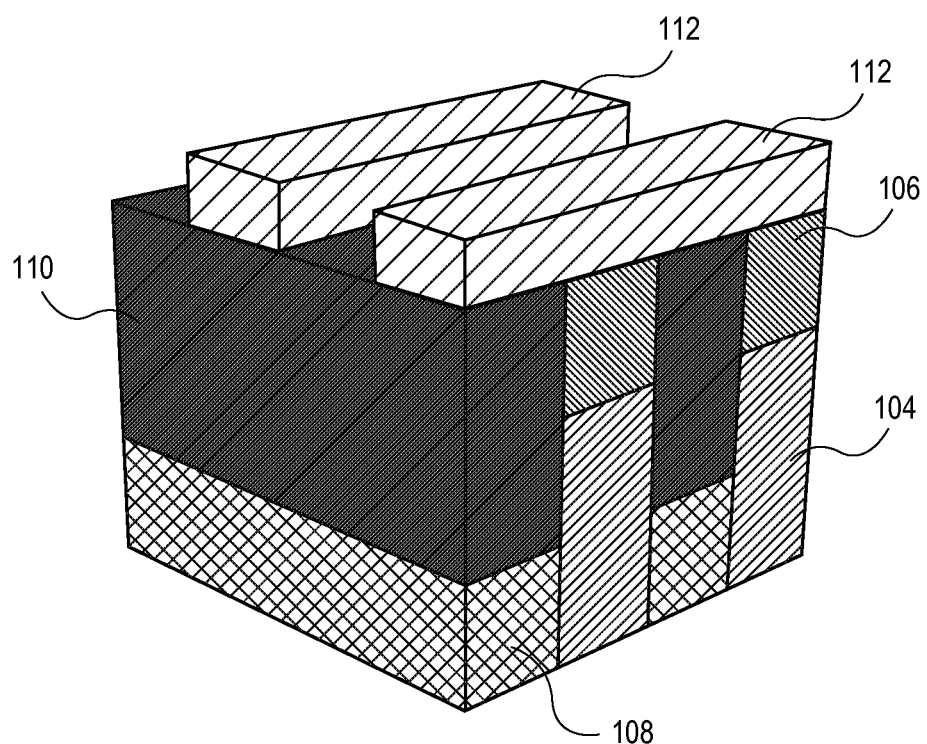
FIG. 1D illustrates the structure of FIG. 1C following deposition and patterning a hardmask layer.
Figure 1E:
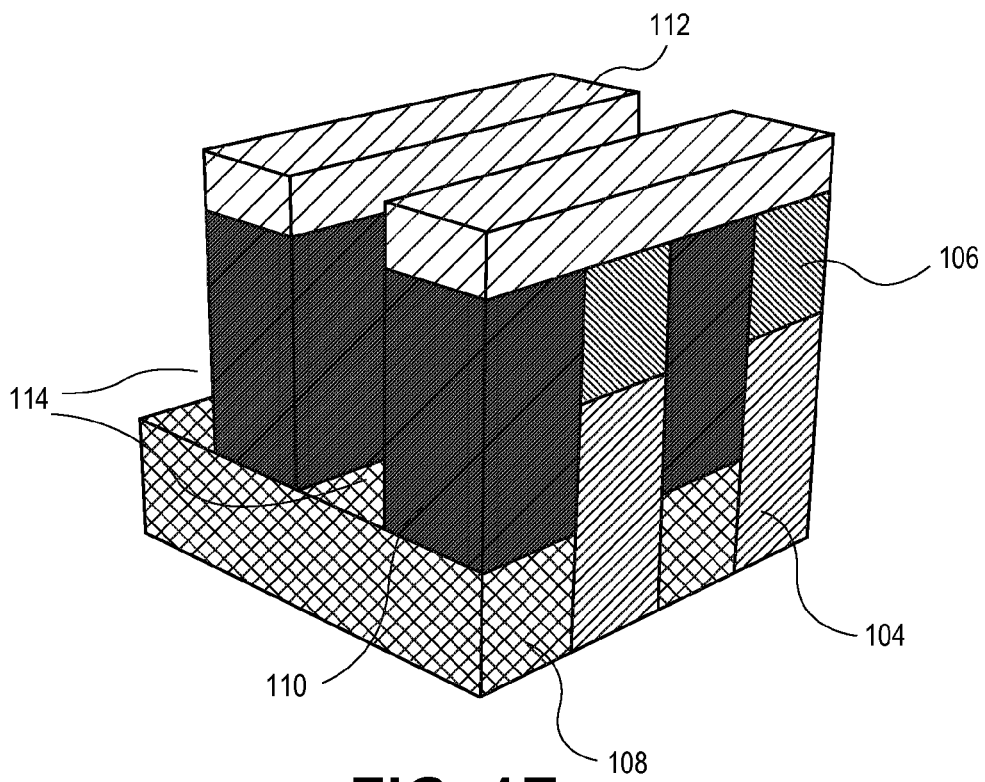
FIG. 1E illustrates the structure of FIG. 1D following trench formation defined using the pattern of the hardmask of FIG. 1D.
Figure 1F:
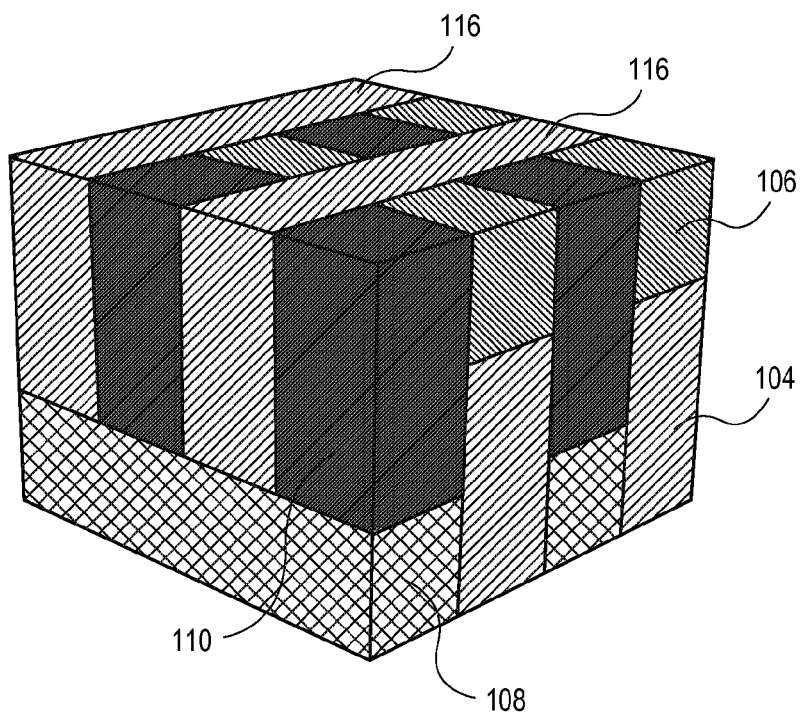
FIG. 1F illustrates the structure of FIG. 1E following ILD formation in the trenches of FIG. 1E and removal of the second hardmask.
Figure 1G:
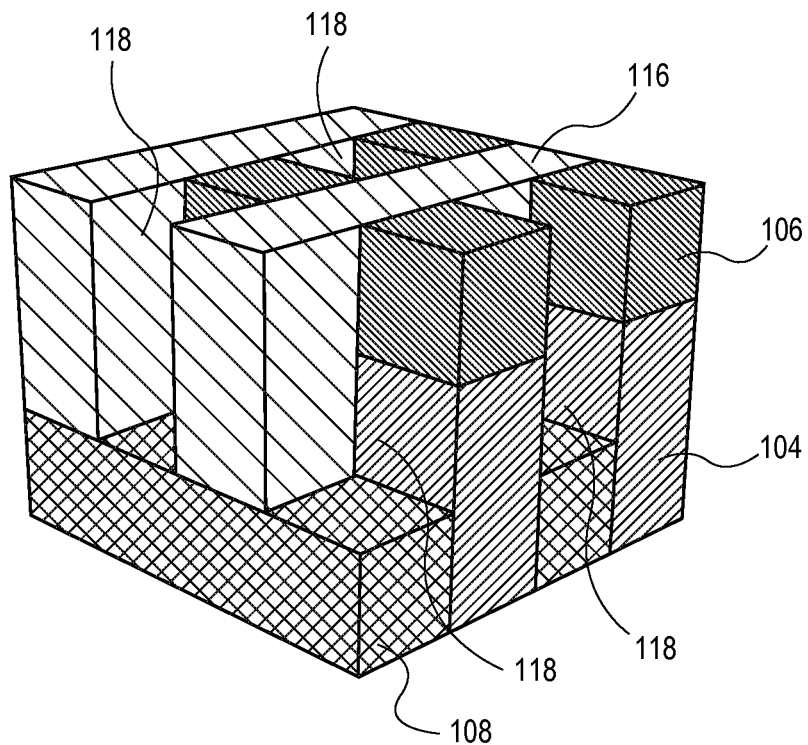
FIG. 1G illustrates the structure of FIG. 1F following removal of the remaining portions of hardmask layer occupying all possible via locations.
Figure 1H:
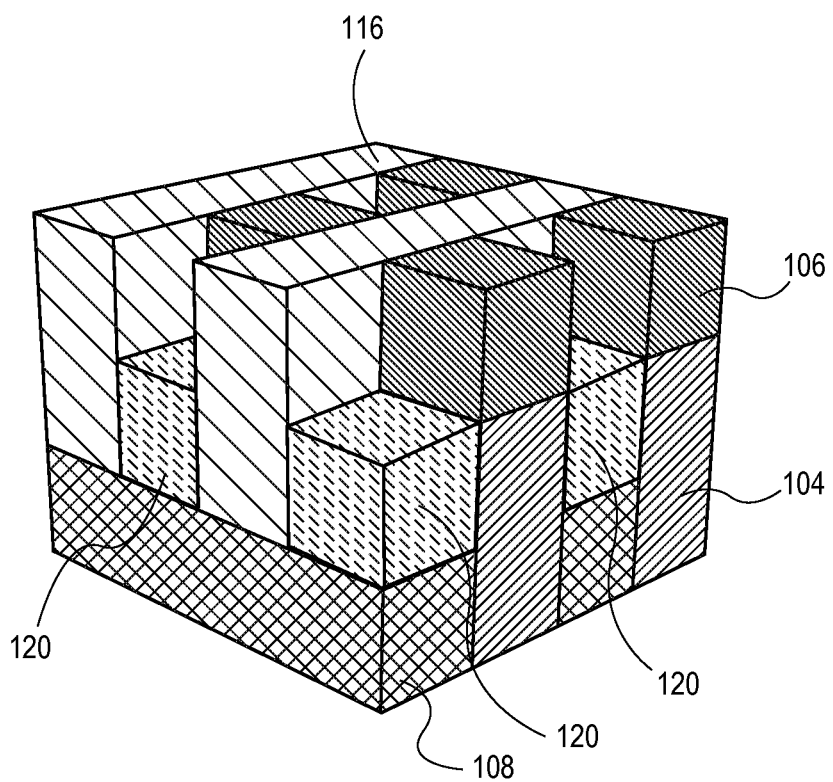
FIG. 1H illustrates the structure of FIG. 1G following photobucket formation in all possible via locations.
Figure 1I:
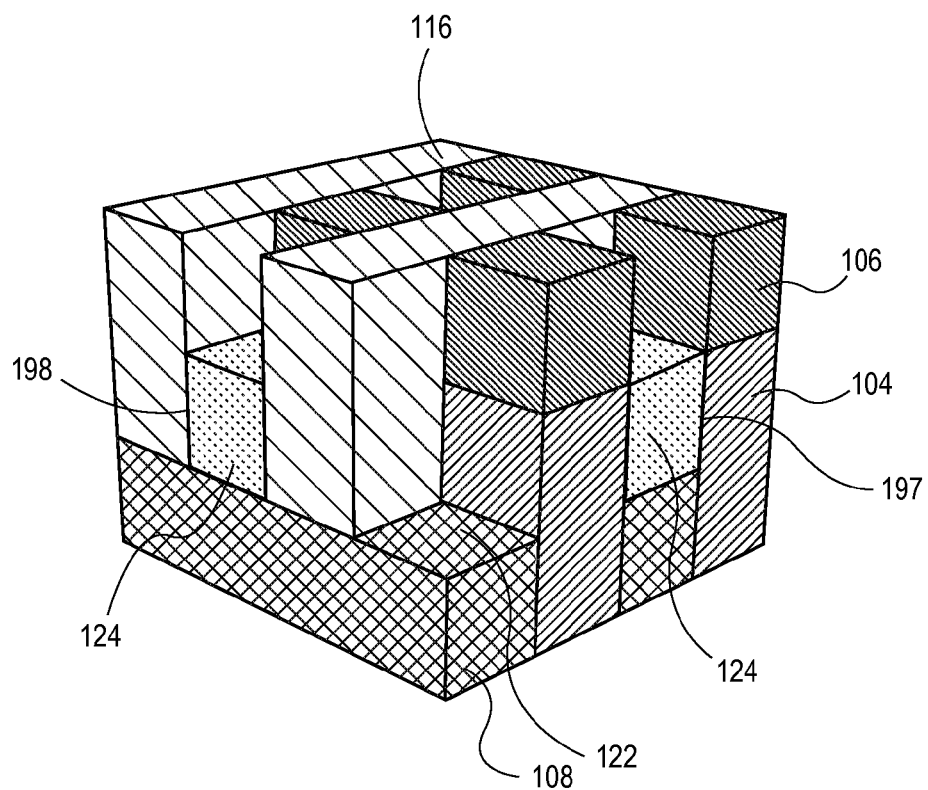
FIG. 1I illustrates the structure of FIG. 1H following via location selection.
Figure 1J:
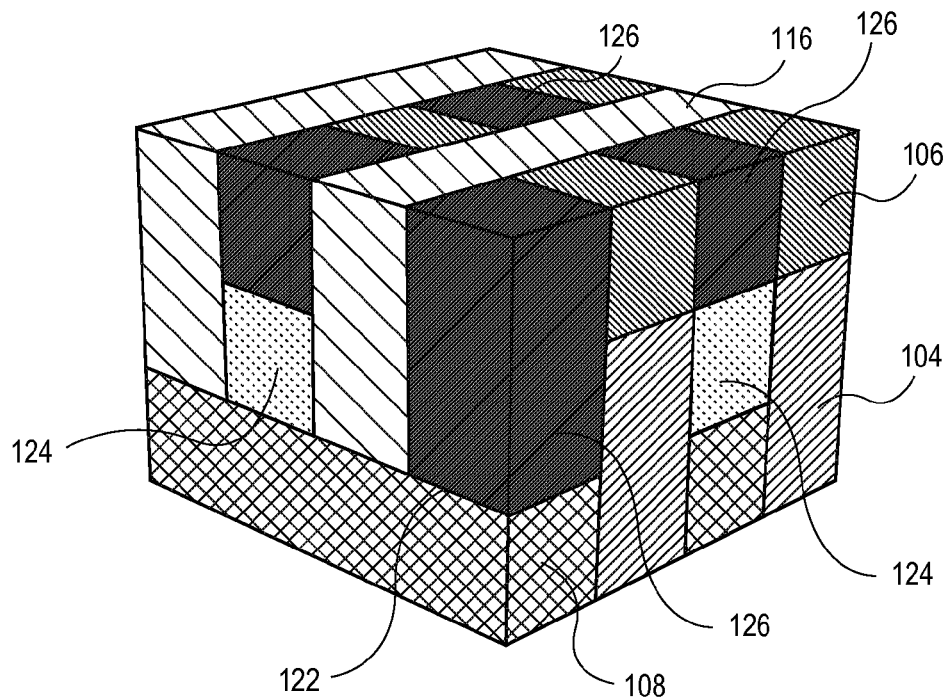
FIG. 1J illustrates the structure of FIG. 1I following hardmask fill in the openings of FIG. 1I.
Figure 1K:
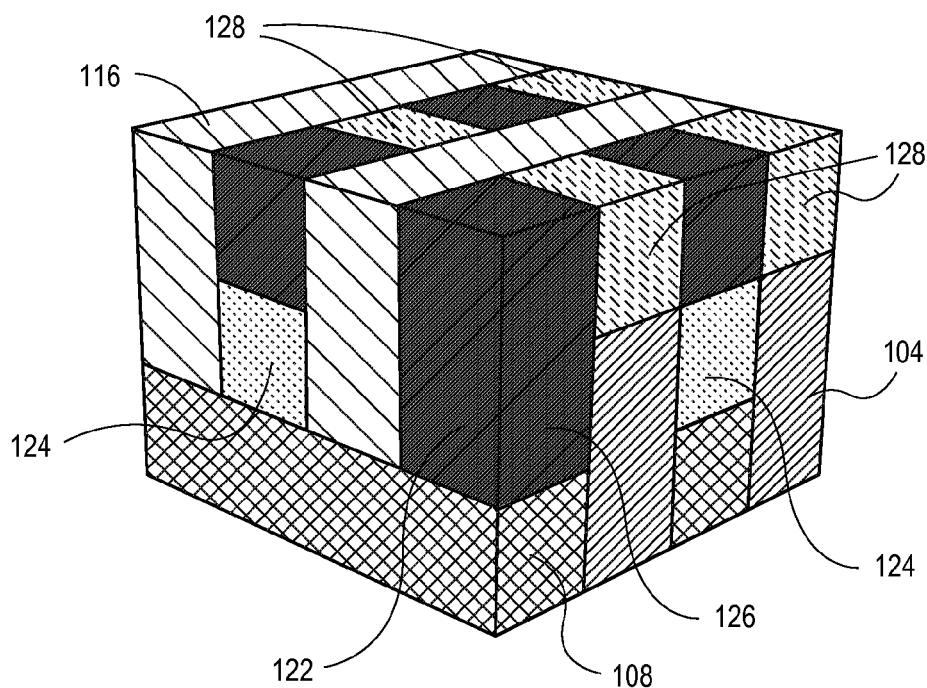
FIG. 1K illustrates the structure of FIG. 1J following removal of the plug cap layer and formation of a second plurality of photobuckets.
Figure 1L:
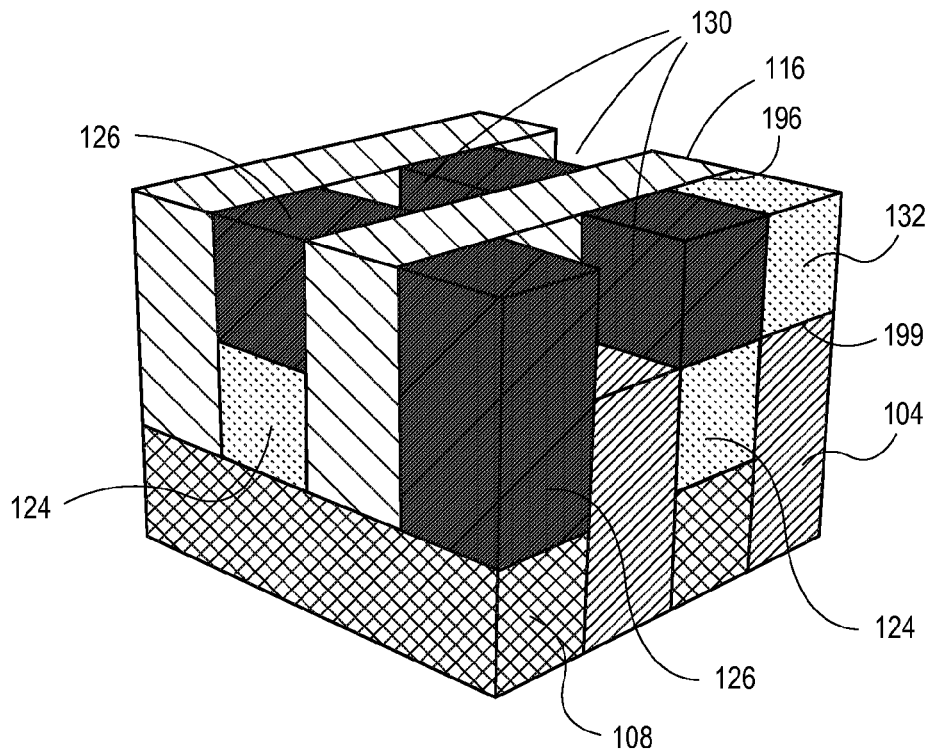
FIG. 1L illustrates the structure of FIG. 1K following plug location selection.
Figure 1M:
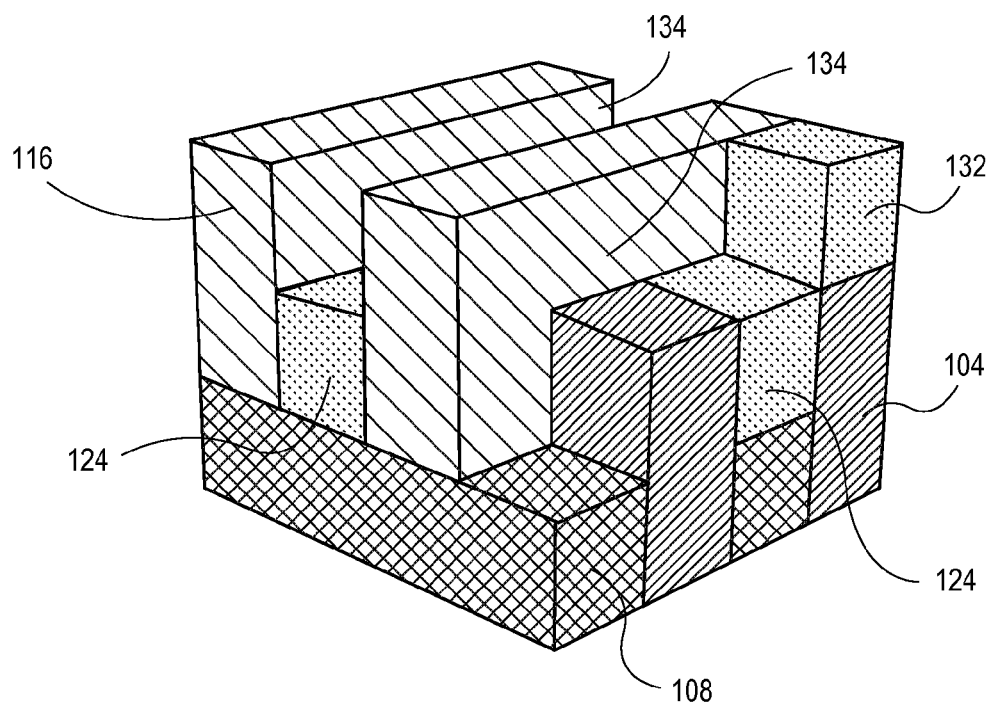
FIG. 1M illustrates the structure of FIG. 1L following removal of the hardmask layer of FIG. 1L.
Figure 1N:
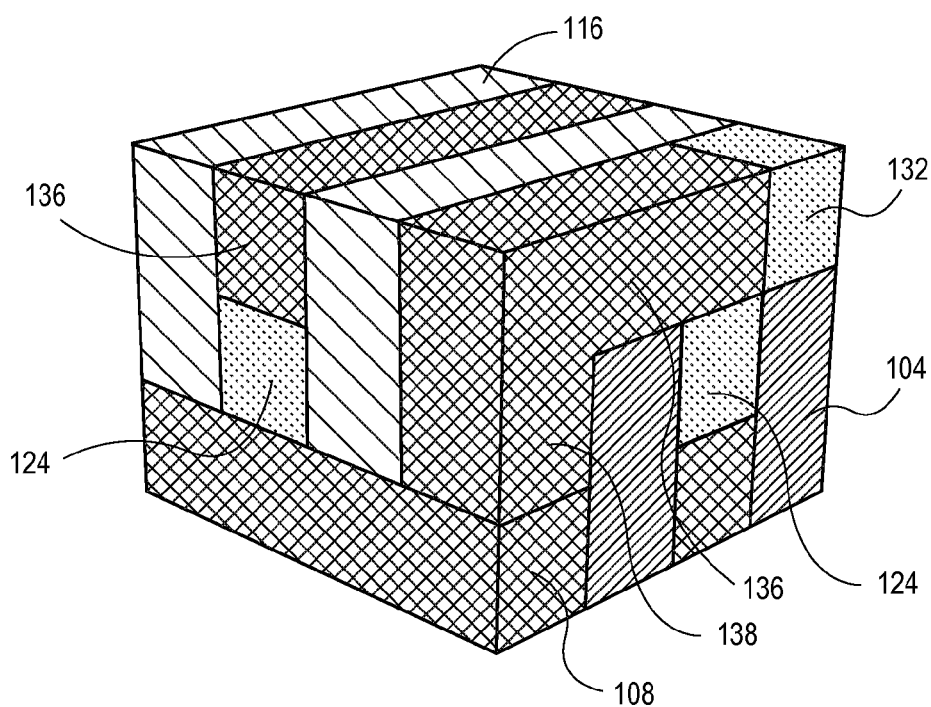

FIGS. 1A-1N illustrate portions of integrated circuit layers representing various operations in a method of subtractive self-aligned via and plug patterning, in accordance with an embodiment of the present invention. In each illustration at each described operation, an angled three-dimensional cross-section view is provided.

FIG. 1A illustrates a starting point structure 100 for a subtractive via and plug process following deep metal line fabrication, in accordance with an embodiment of the present invention. Referring to FIG. 1A, structure 100 includes metal lines 102 with intervening interlayer dielectric (ILD) lines 104. The ILD lines 104 include a plug cap layer 106. In an embodiment, as described in greater detail below in association with FIG. 1E, the plug cap layer 106 is later patterned to ultimately define all possible location for later plug formation.

In an embodiment, the grating structure formed by metal lines 102 is a tight pitch grating structure. In one such embodiment, the tight pitch is not achievable directly through conventional lithography. For example, a pattern based on conventional lithography may first be formed, but the pitch may be halved by the use of spacer mask patterning, as is known in the art. Even further, the original pitch may be quartered by a second round of spacer mask patterning. Accordingly, the grating-like pattern of FIG. 1A may have metal lines spaced at a constant pitch and having a constant width. The pattern may be fabricated by a pitch halving or pitch quartering approach. It is also to be understood that some of the lines 102 may be associated with underlying vias for coupling to a previous interconnect layer.

In an embodiment, the metal lines 102 are formed by patterning trenches into an ILD material (e.g., the ILD material of lines 104) having the plug cap layer 106 formed thereon. The trenches are then filled by metal and, if needed, planarized to the plug cap layer 106. In an embodiment, the metal trench and fill process involves high aspect ratio features. For example, in one embodiment, the aspect ratio of metal line height (h) to metal line width (w) is approximately in the range of 5-10.

In an embodiment, as used throughout the present description, interlayer dielectric (ILD) material, such as the material of the ILD lines 104, is composed of or includes a layer of a dielectric or insulating material. Examples of suitable dielectric materials include, but are not limited to, oxides of silicon (e.g., silicon dioxide ($SiO_2$)), doped oxides of silicon, fluorinated oxides of silicon, carbon doped oxides of silicon, various low-k dielectric materials known in the arts, and combinations thereof. The interlayer dielectric material may be formed by conventional techniques, such as, for example, chemical vapor deposition (CVD), physical vapor deposition (PVD), or by other deposition methods.

In an embodiment, as is also used throughout the present description, interconnect material, such as the material of metal lines 102, is composed of one or more metal or other conductive structures. A common example is the use of copper lines and structures that may or may not include barrier layers between the copper and surrounding ILD material. As used herein, the term metal includes alloys, stacks, and other combinations of multiple metals. For example, the metal interconnect lines may include barrier layers, stacks of different metals or alloys, etc. The interconnect lines are also sometimes referred to in the arts as traces, wires, lines, metal, or simply interconnect.

In an embodiment, as is also used throughout the present description, plug and/or cap and/or hardmask materials, such, such as plug cap layer 106, are composed of dielectric materials different from the interlayer dielectric material. In one embodiment, these materials are sacrificial, while interlayer dielectric materials are preserved at least somewhat in a final structure. In some embodiments, a plug and/or cap and/or hardmask material includes a layer of a nitride of silicon (e.g., silicon nitride) or a layer of an oxide of silicon, or both, or a combination thereof. Other suitable materials may include carbon-based materials. In another embodiment, a plug and/or cap and/or hardmask material includes a metal species. For example, a hardmask or other overlying material may include a layer of a nitride of titanium or another metal (e.g., titanium nitride). Potentially lesser amounts of other materials, such as oxygen, may be included in one or more of these layers. Alternatively, other plug and/or cap and/or hardmask material layers known in the arts may be used depending upon the particular implementation. The plug and/or cap and/or hardmask material layers maybe formed by CVD, PVD, or by other deposition methods.

It is to be understood that the layers and materials described in association with FIG. 1A are typically formed on or above an underlying semiconductor substrate or structure, such as underlying device layer(s) of an integrated circuit. In an embodiment, an underlying semiconductor substrate represents a general workpiece object used to manufacture integrated circuits. The semiconductor substrate often includes a wafer or other piece of silicon or another semiconductor material. Suitable semiconductor substrates include, but are not limited to, single crystal silicon, polycrystalline silicon and silicon on insulator (SOI), as well as similar substrates formed of other semiconductor materials. The semiconductor substrate, depending on the stage of manufacture, often includes transistors, integrated circuitry, and the like. The substrate may also include semiconductor materials, metals, dielectrics, dopants, and other materials commonly found in semiconductor substrates. Furthermore, the structure depicted in FIG. 1A may be fabricated on underlying lower level back end of line (BEOL) interconnect layers.

FIG. 1B illustrates the structure of FIG. 1A following recessing of the metal lines, in accordance with an embodiment of the present invention. Referring to FIG. 1B, the metal lines 102 are recessed selectively to provide first level metal lines 108. The recessing is performed selectively to the ILD lines 104 and the plug cap layer 106. The recessing may be performed by etching through dry etch, wet etch, or a combination thereof. The extent of recessing may be determined by the targeted thickness (th) of the first level metal lines 108 for use as suitable conductive interconnect lines within a back end of line (BEOL) interconnect structure.

FIG. 1C illustrates the structure of FIG. 1B following hardmask fill in the recessed regions of the recessed metal lines, in accordance with an embodiment of the present invention. Referring to FIG. 1C, hardmask layer 110 is formed in the regions formed during recessing to form the first level metal lines 108. The hardmask layer 110 may be formed by a material deposition and chemical mechanical planarization (CMP) process to the level of plug cap layer 106, or by a controlled bottom-up only growth process. In one specific embodiment, the hardmask layer 110 is composed of a carbon-rich material.

FIG. 1D illustrates the structure of FIG. 1C following deposition and patterning a hardmask layer, in accordance with an embodiment of the present invention. Referring to FIG. 1D a second hardmask layer 112 is formed on or above the hardmask layer 110 and plug cap layer 106. In one such embodiment, the second hardmask layer 112 is formed with a grating pattern orthogonal to the grating pattern of the first level metal lines 108/ILD lines 104, as is depicted in FIG. 1D. In one specific embodiment, the second hardmask layer 112 is composed of a silicon-based anti-reflective coating material. In an embodiment, the grating structure formed by second hardmask layer 112 is a tight pitch grating structure. In one such embodiment, the tight pitch is not achievable directly through conventional lithography. For example, a pattern based on conventional lithography may first be formed, but the pitch may be halved by the use of spacer mask patterning, as is known in the art. Even further, the original pitch may be quartered by a second round of spacer mask patterning. Accordingly, the grating-like pattern of the second hardmask layer 112 of FIG. 1D may have hardmask lines spaced at a constant pitch and having a constant width.

FIG. 1E illustrates the structure of FIG. 1D following trench formation defined using the pattern of the hardmask of FIG. 1D, in accordance with an embodiment of the present invention. Referring to FIG. 1E, the exposed regions (i.e., unprotected by 112) of the hardmask layer 110 and the plug cap layer 106 are etched to form trenches 114. The etch stops on, and thus exposes, the top surfaces of the first level metal lines 108 and the ILD lines 104.

FIG. 1F illustrates the structure of FIG. 1E following ILD formation in the trenches of FIG. 1E and removal of the second hardmask, in accordance with an embodiment of the present invention. Referring to FIG. 1F, second ILD lines 116 are formed in the trenches 114 of FIG. 1E. In an embodiment, a flowable ILD material is used to fill trenches 114. In an embodiment, the trenches 114 are filled and the fill material is subsequently planarized. The planarization may further be used to remove second hardmask layer 112, re-exposing the hardmask layer 110 and the plug cap layer 106, as is depicted in FIG. 1F.

Referring again to FIG. 1F, in an embodiment, the resulting structure includes a uniform ILD structure (ILD lines 104+ILD lines 116). The locations of all possible plugs are occupied by the remaining portions of the plug cap layer 106, while all possible via locations are occupied by the remaining portions of hardmask layer 110. In one such embodiment, ILD lines 104 and ILD line 116 are composed of a same material. In another such embodiment, ILD lines 104 and ILD lines 116 are composed of different ILD materials. In either case, in a specific embodiment, a distinction such as a seam between the materials of ILD lines 104 and ILD lines 116 may be observed in the final structure. Furthermore, in an embodiment, there is no distinct etch stop layer where the ILD lines 104 and ILD lines 116 meet, in contrast to conventional single or dual damascene patterning.

FIG. 1G illustrates the structure of FIG. 1F following removal of the remaining portions of hardmask layer occupying all possible via locations, in accordance with an embodiment of the present invention. Referring to FIG. 1G, the remaining portions of hardmask layer 110 are selectively removed to form openings 118 for all possible via locations. In one such embodiment, the hardmask layer 110 is composed substantially of carbon and is removed selectively with an ash process.

FIG. 1H illustrates the structure of FIG. 1G following photobucket formation in all possible via locations, in accordance with an embodiment of the present invention. Referring to FIG. 1H, photobuckets 120 are formed in all possible via locations above exposed portions of the first level metal lines 108. In an embodiment, the openings 118 of FIG. 1G are filled with an ultrafast photoresist or ebeam resist or other photosensitive material. In one such embodiment, a thermal reflow of a polymer into the openings 118 is used following a spin coat application. In one embodiment, the fast photoresist is fabricated by removing a quencher from an existing photoresist material. In another embodiment, the photobuckets 120 are formed by an etch-back process and/or a lithography/shrink/etch process. It is to be understood that the photobuckets need not be filled with actual photoresist, so long as the material acts as a photosensitive switch.

FIG. 1I illustrates the structure of FIG. 1H following via location selection, in accordance with an embodiment of the present invention. Referring to FIG. 1I, the photobuckets 120 from FIG. 1H in select via locations are removed. In locations where vias are not selected to be formed, the photobuckets 120 are retained, converted to a permanent ILD material, or replaced with a permanent ILD material. As an example, FIG. 1I illustrates a via location 122 with corresponding photobucket 120 being removed to expose a portion of one of the first level metal lines 108. The other locations previously occupied by photobuckets 120 are now shown as regions 124 in FIG. 1I. The locations 124 are not selected for via formation and instead make up part of the final ILD structure. In one embodiment, the material of the photobuckets 120 is retained in the locations 124 as a final ILD material. In another embodiment, the material of the photobuckets 120 is modified, e.g., by cross-linking, in the locations 124 to form a final ILD material. In yet another embodiment, the material of the photobuckets 120 in the locations 124 is replaced by a final ILD material.

Referring again to FIG. 1I, to form via location 122, lithography is used to expose the corresponding photobucket 120. However, the lithographic constraints may be relaxed and misalignment tolerance may be high since the photobucket 120 is surrounded by non-photolyzable materials. Furthermore, in an embodiment, instead of exposing at, e.g. 30 mJ/cm2, such a photobucket might be exposed at, e.g., 3 mJ/cm2. Normally this would result in very poor CD control and roughness. But in this case, the CD and roughness control will be defined by the photobucket 120, which can be very well controlled and defined. Thus, the photobucket approach may be used to circumvent imaging/dose tradeoff which limits the throughput of next generation lithographic processes.

Referring again to FIG. 1I, in an embodiment, the resulting structure includes a uniform ILD structure (ILD 124+ ILD lines 104+ILD lines 116). In one such embodiment, two or all of ILD 124, ILD lines 104 and ILD line 116 are composed of a same material. In another such embodiment, ILD 124, ILD lines 104 and ILD lines 116 are composed of different ILD materials. In either case, in a specific embodiment, a distinction such as a seam between the materials of ILD 124 and ILD lines 104 (e.g., seam 197) and/or between ILD 124 and ILD lines 116 (e.g., seam 198) may be observed in the final structure.

FIG. 1J illustrates the structure of FIG. 1I following hardmask fill in the openings of FIG. 1I, in accordance with an embodiment of the present invention. Referring to FIG. 1J, a hardmask layer 126 is formed in via location 122 and above ILD locations 124. The hardmask layer 126 may be formed by deposition and subsequent chemical mechanical planarization.

FIG. 1K illustrates the structure of FIG. 1J following removal of the plug cap layer and formation of a second plurality of photobuckets, in accordance with an embodiment of the present invention. Referring to FIG. 1K, the plug cap layer 106 is removed, e.g., by a selective etching process. Photobuckets 128 are then formed in all possible plug locations above exposed portions of the ILD lines 104. In an embodiment, openings formed upon removal of the plug cap layer 106 are filled with an ultrafast photoresist or ebeam resist or other photosensitive material. In one such embodiment, a thermal reflow of a polymer into the openings is used following a spin coat application. In one embodiment, the fast photoresist is fabricated by removing a quencher from an existing photoresist material. In another embodiment, the photobuckets 128 are formed by an etch-back process and/or a lithography/shrink/etch process. It is to be understood that the photobuckets need not be filled with actual photoresist, so long as the material acts as a photosensitive switch.

FIG. 1L illustrates the structure of FIG. 1K following plug location selection, in accordance with an embodiment of the present invention. Referring to FIG. 1L, the photobuckets 128 from FIG. 1K that are not in select plug locations are removed. In locations where plugs are selected to be formed, the photobuckets 128 are retained, converted to a permanent ILD material, or replaced with a permanent ILD material. As an example, FIG. 1L illustrates non-plug locations 130 with corresponding photobuckets 128 being removed to expose a portion of the ILD lines 104. The other location previously occupied by photobucket 128 is now shown as region 132 in FIG. 1L. The region 132 is selected for plug formation and makes up part of the final ILD structure. In one embodiment, the material of the corresponding photobucket 128 is retained in the region 132 as a final ILD material. In another embodiment, the material of the photobucket 128 is modified, e.g., by cross-linking, in the region 132 to form a final ILD material. In yet another embodiment, the material of the photobucket 128 in the region 132 is replaced by a final ILD material. In any case, region 132 can also be referred to as plug 132.

Referring again to FIG. 1L, to form openings 130, lithography is used to expose the corresponding photobuckets 128. However, the lithographic constraints may be relaxed and misalignment tolerance may be high since the photobuckets 128 are surrounded by non-photolyzable materials. Furthermore, in an embodiment, instead of exposing at, e.g. 30 mJ/cm2, such photobuckets might be exposed at, e.g., 3 mJ/cm2. Normally this would result in very poor CD control and roughness. But in this case, the CD and roughness control will be defined by the photobuckets 128, which can be very well controlled and defined. Thus, the photobucket approach may be used to circumvent imaging/dose tradeoff which limits the throughput of next generation lithographic processes.

Referring again to FIG. 1L, in an embodiment, the resulting structure includes a uniform ILD structure (plug 132+ ILD 124+ILD lines 104+ILD lines 116). In one such embodiment, two or more of plug 132, ILD 124, ILD lines 104 and ILD line 116 are composed of a same material. In another such embodiment, plug 132, ILD 124, ILD lines 104 and ILD lines 116 are composed of different ILD materials. In either case, in a specific embodiment, a distinction such as a seam between the materials of plug 132 and ILD lines 104 (e.g., seam 199) and/or between plug 132 and ILD lines 116 (e.g., seam 196) may be observed in the final structure.

FIG. 1M illustrates the structure of FIG. 1L following removal of the hardmask layer of FIG. 1L, in accordance with an embodiment of the present invention. Referring to FIG. 1M, the hardmask layer 126 is selectively removed to form metal line and via openings 134. In one such embodiment, the hardmask layer 126 is composed substantially of carbon and is removed selectively with an ash process.

FIG. 1N illustrates the structure of FIG. 1M following metal line and via formation, in accordance with an embodiment of the present invention. Referring to FIG. 1N, metal lines 134 and vias (one shown as 138) are formed upon metal fill of the openings 134 of FIG. 1M. The metal lines 136 are coupled to the underlying metal lines 108 by vias 138 and are interrupted by plugs 132. In an embodiment, openings 134 are filled in a damascene approach, where metal is used to overfill the openings and is then planarized back to provide the structure shown in FIG. 1N. Thus, the metal (e.g., copper and associated barrier and seed layers) deposition and planarization process to form metal lines and vias in the above approach may be that typically used for standard back end of line (BEOL) single or dual damascene processing. In an embodiment, in subsequent fabrication operations, the ILD lines 116 may be removed to provide air gaps between the resulting metal lines 136.

The structure of FIG. 1N may subsequently be used as a foundation for forming subsequent metal line/via and ILD layers. Alternatively, the structure of FIG. 1N may represent the final metal interconnect layer in an integrated circuit. It is to be understood that the above process operations may be practiced in alternative sequences, not every operation need be performed and/or additional process operations may be performed. In any case, the resulting structures enable fabrication of vias that are directly centered on underlying metal lines. That is, the vias may be wider than, narrower than, or the same thickness as the underlying metal lines, e.g., due to non-perfect selective etch processing. Nonetheless, in an embodiment, the centers of the vias are directly aligned (match up) with the centers of the metal lines. Furthermore, the ILD used to select which plugs and vias will likely be very different from the primary ILD and will be perfectly self-aligned in both directions. As such, in an embodiment, offset due to conventional lithograph/dual damascene patterning that must otherwise be tolerated, is not a factor for the resulting structures described herein. Referring again to FIG. 1N, then, self-aligned fabrication by the subtractive approach may be complete at this stage. A next layer fabricated in a like manner likely requires initiation of the entire process one again. Alternatively, other approaches may be used at this stage to provide additional interconnect layers, such as conventional dual or single damascene approaches.

The above process described process flow involves use of deep trench etching. In another aspect, a shallower approach involves a plug-only self-aligned subtractive processing scheme. As an example, FIGS. 2A-2D illustrate portions of integrated circuit layers representing various operations in a method of subtractive self-aligned plug patterning, in accordance with another embodiment of the present invention. In each illustration at each described operation, plan views are shown on top, and corresponding cross-sectional views are shown on the bottom. These views will be referred to herein as corresponding cross-sectional views and plan views.

Figure 2A:
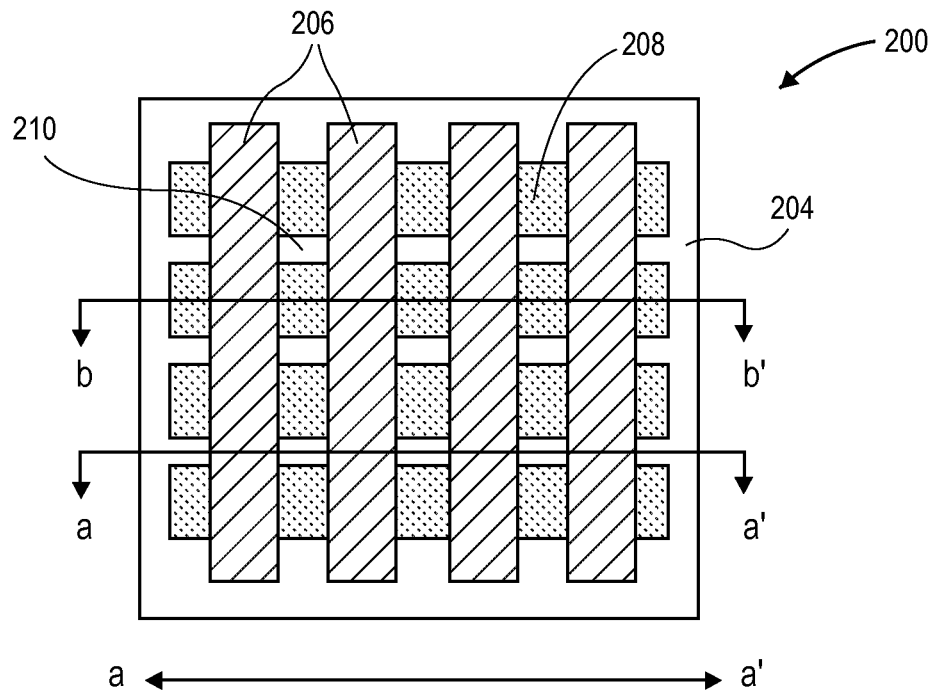
FIGS. 2A-2D illustrate portions of integrated circuit layers representing various operations in a method of subtractive self-aligned plug patterning, in accordance with another embodiment of the present invention, where.
Figure 2A:
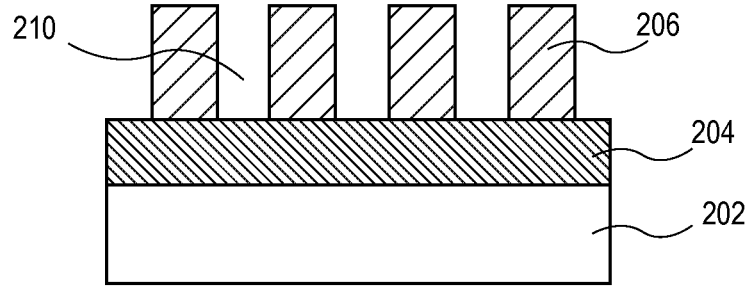
Figure 2A:
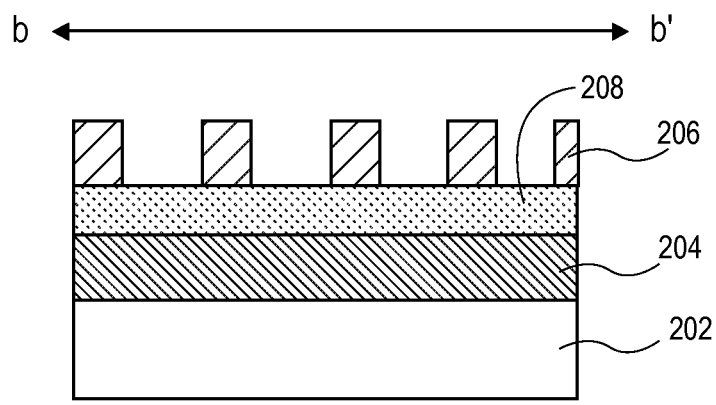

FIG. 2A illustrates a plan view and corresponding cross-sectional views of a starting plug grid, in accordance with an embodiment of the present invention. Referring to the plan view and corresponding cross-sectional views (a) and (b) taken along axes a-a' and b-b', respectively, a starting plug grid structure 200 includes an ILD layer 202 having a first hardmask layer 204 disposed thereon. A second hardmask layer 208 is disposed on the first hardmask layer 204 and is patterned to have a grating structure. A third hardmask layer 206 is disposed on the second hardmask layer 208 and on the first hardmask layer 204. Additionally, openings 210 remain between the grating structure of the second hardmask layer 208 and the third hardmask layer 206.

Figure 2B:
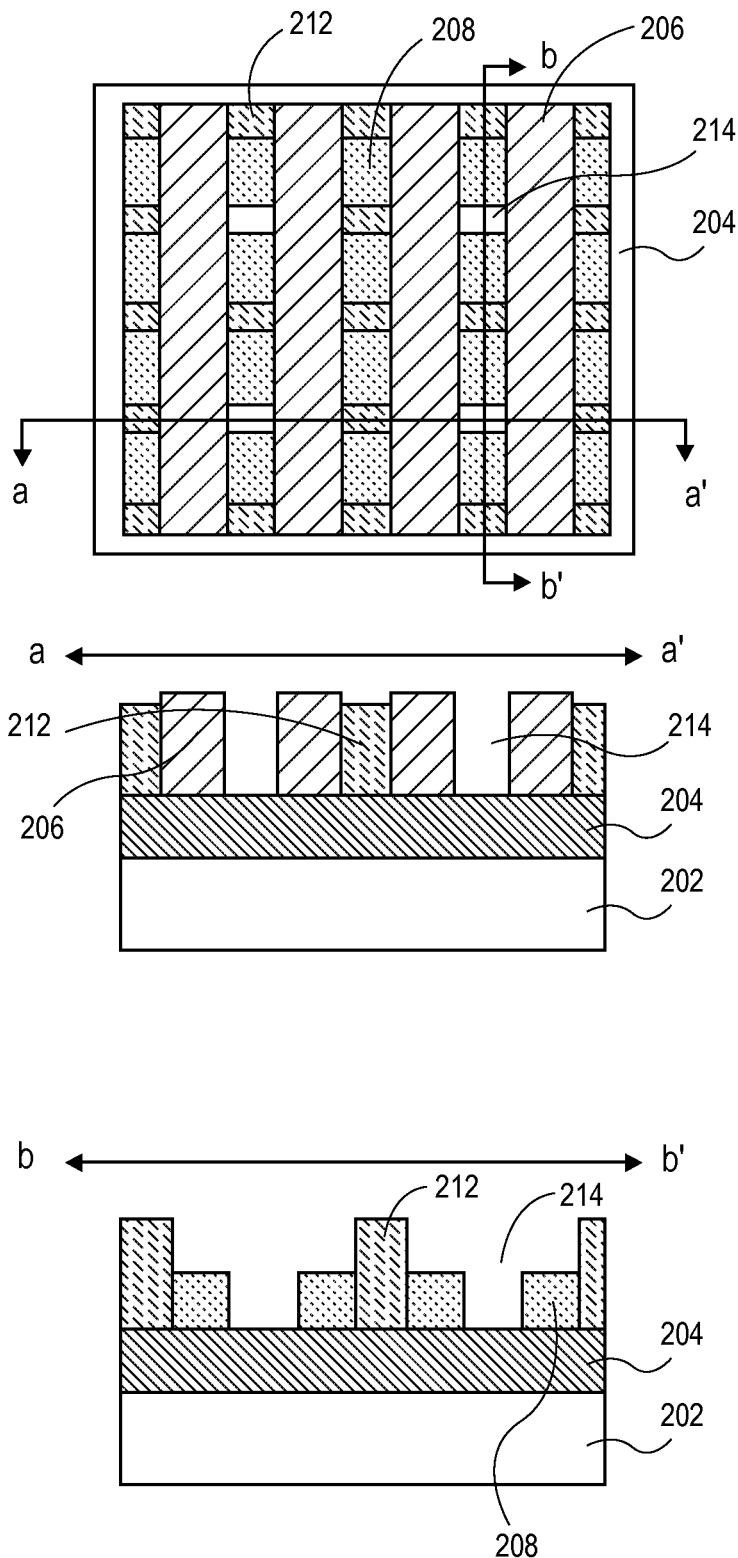

FIG. 2B illustrates a plan view and corresponding cross-sectional views of the structure of FIG. 2A following photobucket fill, exposure and development, in accordance with an embodiment of the present invention. Referring to the plan view and corresponding cross-sectional views (a) and (b) taken along axes a-a' and b-b', respectively, photobuckets 212 are formed in the openings 210 of FIG. 2A. Subsequently, select photobuckets are exposed and removed to provide selected plug locations 214, as depicted in FIG. 2B.

Figure 2C:
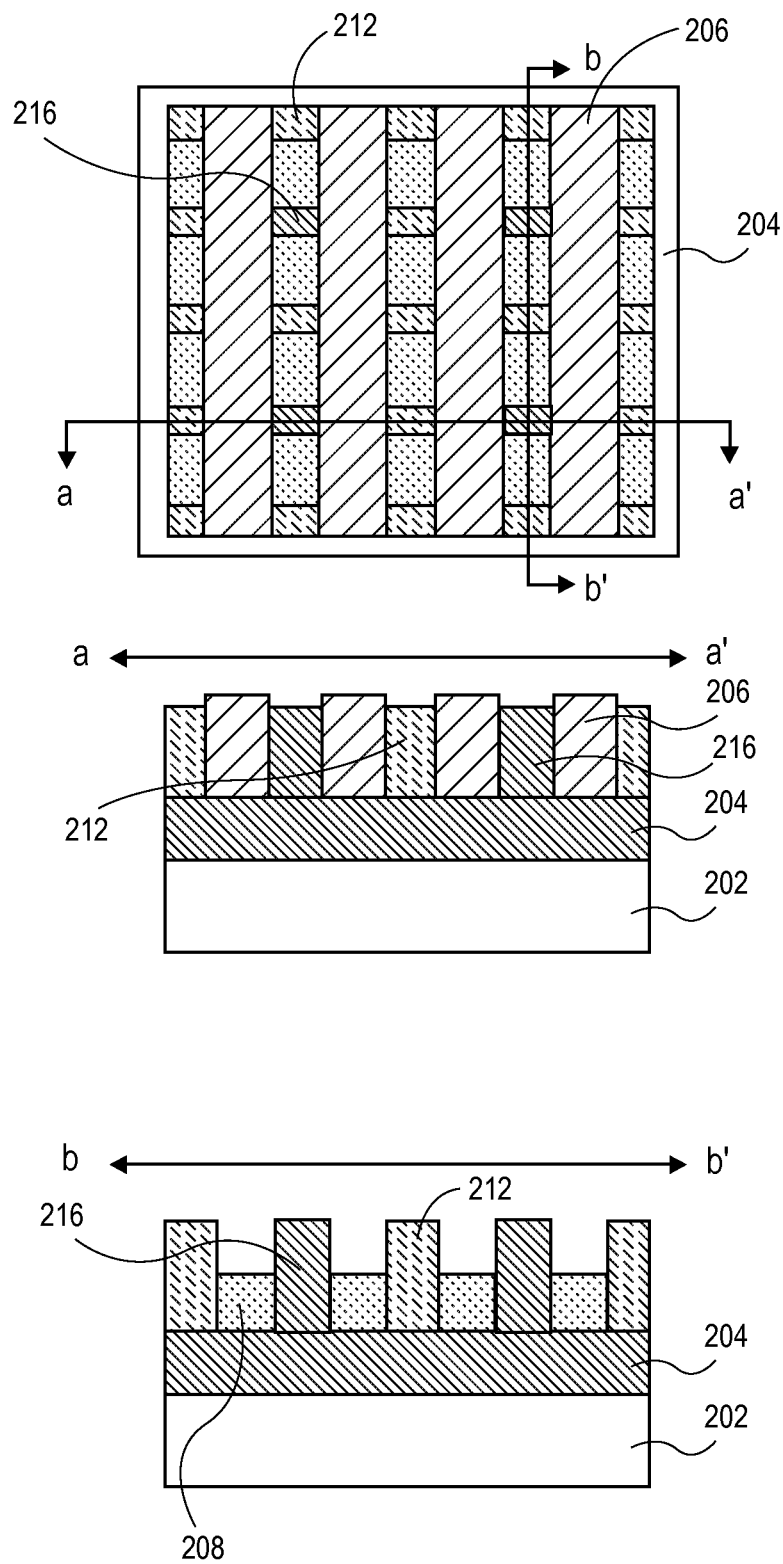

FIG. 2C illustrates a plan view and corresponding cross-sectional views of the structure of FIG. 2B following plug formation, in accordance with an embodiment of the present invention. Referring to the plan view and corresponding cross-sectional views (a) and (b) taken along axes a-a' and b-b', respectively, plugs 216 are formed in the openings 214 of FIG. 2B. In one embodiment, the plugs 216 are formed by a spin-on approach and/or a deposition and etch back approach.

Figure 2D:
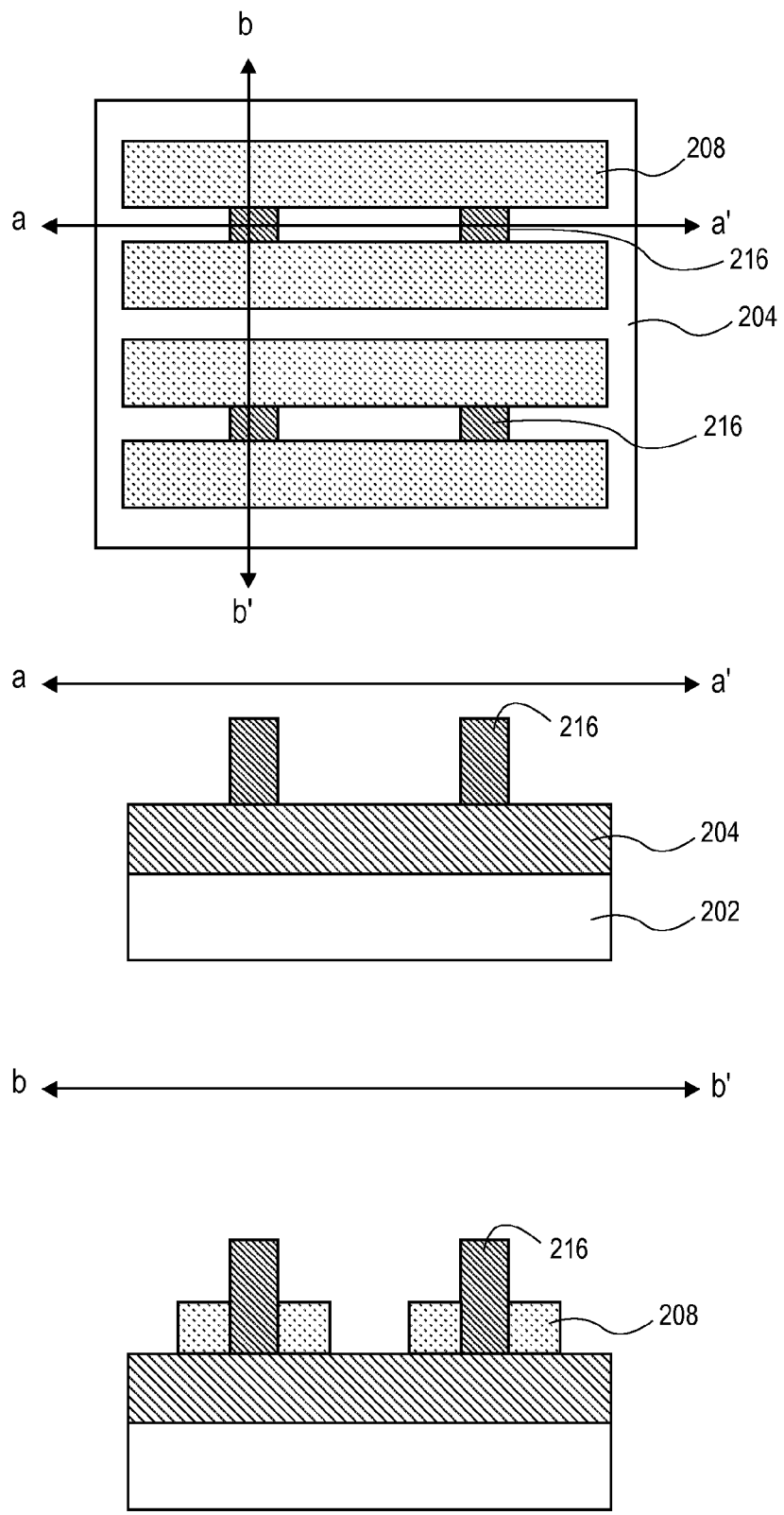

FIG. 2D illustrates a plan view and corresponding cross-sectional views of the structure of FIG. 2C following removal of a hardmask layer and the remaining photobuckets, in accordance with an embodiment of the present invention. Referring to the plan view and corresponding cross-sectional views (a) and (b) taken along axes a-a' and b-b', respectively, the third hardmask layer 206 is removed, leaving the second hardmask layer 208 and the plugs 216. The resulting pattern (second hardmask layer 208 and plugs 216) can subsequently be used to pattern hardmask layer 204 for ultimate patterning of ILD layer 202. In one embodiment, the third hardmask layer 206 is composed substantially of carbon and is removed by performing an ash process.

Thus, the structure of FIG. 2D may subsequently be used as a foundation for forming ILD line and plug patterns. It is to be understood that the above process operations may be practiced in alternative sequences, not every operation need be performed and/or additional process operations may be performed. In any case, the resulting structures enable fabrication of self-aligned plugs. As such, in an embodiment, offset due to conventional lithograph/dual damascene patterning that must otherwise be tolerated, is not a factor for the resulting structures described herein.

Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 3:
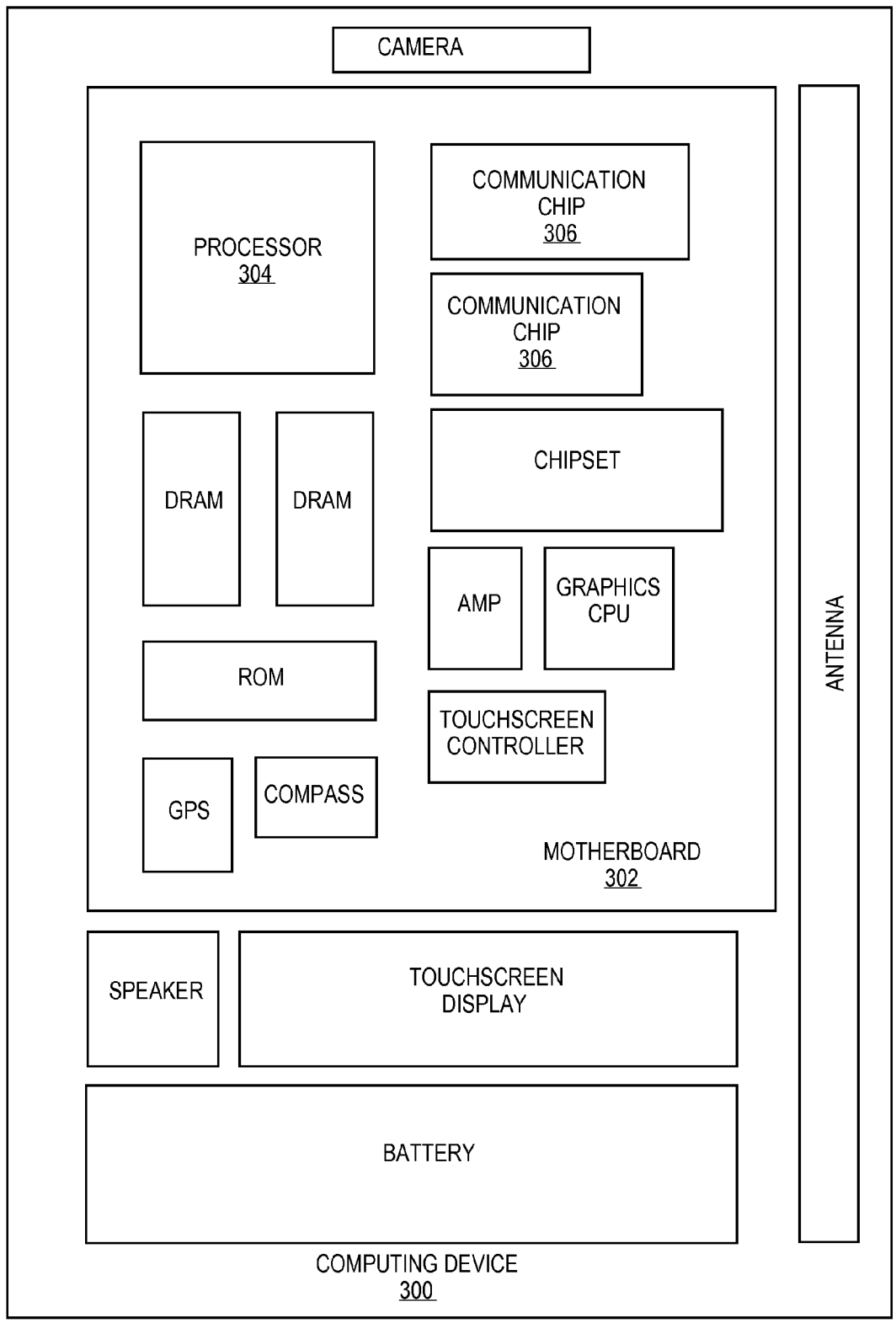
FIG. 3 illustrates a computing device in accordance with one implementation of the invention.

FIG. 3 illustrates a computing device 300 in accordance with one implementation of the invention. The computing device 300 houses a board 302. The board 302 may include a number of components, including but not limited to a processor 304 and at least one communication chip 306. The processor 304 is physically and electrically coupled to the board 302. In some implementations the at least one communication chip 306 is also physically and electrically coupled to the board 302. In further implementations, the communication chip 306 is part of the processor 304.

Depending on its applications, computing device 300 may include other components that may or may not be physically and electrically coupled to the board 302. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 306 enables wireless communications for the transfer of data to and from the computing device 300. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 306 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 300 may include a plurality of communication chips 306. For instance, a first communication chip 306 may be dedicated to shorter range wireless communications such as Wi-Fi and Bluetooth and a second communication chip 306 may be dedicated to longer range wireless communications such as GPS, EDGE, GPRS, CDMA, WiMAX, LTE, Ev-DO, and others.

The processor 304 of the computing device 300 includes an integrated circuit die packaged within the processor 304. In some implementations of the invention, the integrated circuit die of the processor includes one or more structures, such as self-aligned vias and plugs, built in accordance with implementations of the invention. The term "processor" may refer to any device or portion of a device that processes electronic data from registers and/or memory to transform that electronic data into other electronic data that may be stored in registers and/or memory.

The communication chip 306 also includes an integrated circuit die packaged within the communication chip 306. In accordance with another implementation of the invention, the integrated circuit die of the communication chip includes one or more structures, such as self-aligned vias and plugs, built in accordance with implementations of the invention.

In further implementations, another component housed within the computing device 300 may contain an integrated circuit die that includes one or more structures, such as self-aligned vias and plugs, built in accordance with implementations of the invention.

In various implementations, the computing device 300 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 300 may be any other electronic device that processes data.

Thus, embodiments of the present invention include subtractive self-aligned via and plug patterning for back end of line (BEOL) interconnects.

In an embodiment, an interconnect structure for an integrated circuit includes a first layer of the interconnect structure disposed above a substrate. The first layer includes a first grating of alternating metal lines and dielectric lines in a first direction. The dielectric lines have an uppermost surface higher than an uppermost surface of the metal lines. The interconnect structure further includes a second layer of the interconnect structure disposed above the first layer of the interconnect structure. The second layer includes a second grating of alternating metal lines and dielectric lines in a second direction, perpendicular to the first direction. The dielectric lines have a lowermost surface lower than a lowermost surface of the metal lines. The dielectric lines of the second grating overlap and contact, but are distinct from, the dielectric lines of the first grating. The metal lines of the first grating are spaced apart from the metal lines of the second grating.

In one embodiment, the interconnect structure further includes a conductive via disposed between and coupling a metal line of the first grating to a metal line of the second grating. The conductive via is directly adjacent to and in a same plane as a portion of a dielectric line of the first grating and a portion of a dielectric line of the second grating.

In one embodiment, the conductive via has a center directly aligned with a center of the metal line of the first grating and with a center of the metal line of the second grating.

In one embodiment, the dielectric lines of the first grating are composed of a first dielectric material, and the dielectric lines of the second grating are composed of a second, different dielectric material.

In one embodiment, the dielectric lines of the first grating and the dielectric lines of the second grating are composed of a same dielectric material.

In one embodiment, a metal line of the second grating is disrupted by a plug having a center directly aligned with a center of a dielectric line of the first grating, the plug composed of a first dielectric material. The plug is distinct from, but in contact with, the dielectric line of the first grating and a dielectric line of the second grating.

In one embodiment, the dielectric lines of the first grating are composed of a second dielectric material, and the dielectric lines of the second grating are composed of a third dielectric material, and none of the first dielectric material, the second dielectric material, and the third dielectric material are the same.

In one embodiment, the dielectric lines of the first grating are composed of a second dielectric material, and the dielectric lines of the second grating are composed of a third dielectric material, and two or more of the first dielectric material, the second dielectric material, and the third dielectric material are the same.

In one embodiment, the interconnect structure further includes a dielectric region disposed between and in contact with a metal line of the first grating and a metal line of the second grating. The dielectric region is directly adjacent to and in a same plane as a portion of a dielectric line of the first grating and a portion of a dielectric line of the second grating.

In one embodiment, the dielectric region is composed of a first dielectric material, the dielectric lines of the first grating are composed of a second dielectric material, and the dielectric lines of the second grating are composed of a third dielectric material, and none of the first dielectric material, the second dielectric material, and the third dielectric material are the same.

In one embodiment, the dielectric region is composed of a first dielectric material, the dielectric lines of the first grating are composed of a second dielectric material, and the dielectric lines of the second grating are composed of a third dielectric material, and two or more of the first dielectric material, the second dielectric material, and the third dielectric material are the same.

In an embodiment, a method of fabricating an interconnect structure for an integrated circuit involves providing a metallization structure composed of an alternating metal line and dielectric line first grating having a first direction. Each dielectric line of the first grating has a top surface with a plug cap layer thereon, and each metal line of the first grating is essentially planar with the top of the plug cap layer. The method also involves recessing the metal lines of the first grating below the top surface of the dielectric lines of the first grating and to form recesses above the metal lines of the first grating. The method also involves forming a first hardmask layer in the recesses above the metal line, the first hardmask layer essentially planar with the top of the plug cap layer. The method also involves forming a second hardmask layer above the plug cap layer and the first hardmask layer, the second hardmask layer having a second grating in a second direction, perpendicular to the first direction. The method also involves forming trenches by removing portions of the plug cap layer and the first hardmask layer exposed by the second hardmask layer. The method also involves forming a dielectric layer in the trenches to provide a third grating of dielectric lines in the second direction. The method also involves removing the second hardmask layer and remaining portions of the first hardmask layer. The method also involves defining one or more conductive via locations above exposed portions of the recessed metal lines of the first grating. The method also involves defining one or more plug locations in regions of the plug cap layer. The method also involves forming a fourth grating of metal lines in the second direction, between the dielectric lines of the third grating and above the first grating.

In one embodiment, defining the one or more via locations involves forming a plurality of photobuckets and exposing one or more of the plurality of photobuckets.

In one embodiment, forming the fourth grating of metal lines further involves forming one or more conductive vias in the corresponding one or more conductive via locations. One of the conductive vias is disposed between and couples a metal line of the first grating to a metal line of the fourth grating. The conductive via is directly adjacent to and in a same plane as a portion of a dielectric line of the first grating and a portion of a dielectric line of the third grating.

In one embodiment, the one of the conductive vias has a center directly aligned with a center of the metal line of the first grating and with a center of the metal line of the fourth grating.

In one embodiment, defining the one or more plug locations in regions of the plug cap layer involves removing the plug cap layer and, subsequently, forming a plurality of photobuckets and exposing one or more of the plurality of photobuckets.

In one embodiment, the method further involves, subsequent to exposing one or more of the plurality of photobuckets, replacing the one or more of the plurality of photobuckets with a dielectric plug. A metal line of the fourth grating is disrupted by the dielectric plug. The dielectric plug has a center directly aligned with a center of a dielectric line of the first grating.

In one embodiment, the dielectric lines of the first grating are composed of a first dielectric material, and the dielectric lines of the third grating are composed of a second, different dielectric material.

In one embodiment, the dielectric lines of the first grating and the dielectric lines of the third grating are composed of a same dielectric material.

In an embodiment, a method of fabricating an interlayer dielectric (ILD) lines and plug patterning mask for integrated circuit manufacturing involves forming a first hardmask layer above an ILD material layer, the first hardmask layer having a first grating in a first direction. The method also involves forming a second hardmask layer above the ILD material layer and above the first hardmask layer, the second hardmask layer having a second grating in a second direction, perpendicular to the first direction. The method also involves forming a plurality of photobuckets in openings between the first and second gratings. The method also involves exposing and removing one or more of the plurality of photobuckets to form one or more corresponding plug locations. The method also involves forming a third hardmask layer in the one or more corresponding plug locations. The method also involves removing remaining photobuckets and the second hardmask layer to form the ILD lines and plug patterning mask.

In one embodiment, the method further involves transferring the pattern of the ILD lines and plug patterning mask into the ILD material layer by an etch process.

In one embodiment, the method further involves, prior to forming the first hardmask layer, forming a fourth hardmask layer on the ILD material layer. The first hardmask layer is formed on the fourth hardmask layer, and transferring the pattern of the ILD lines and plug patterning mask into the ILD material layer involves first transferring the pattern of the ILD lines and plug patterning mask into the fourth hardmask layer.

In one embodiment, the second hardmask layer is composed of carbon, and removing the second hardmask layer involves using an ash process.

What is claimed is:

1. An interconnect structure for an integrated circuit, the interconnect structure comprising:
   a first layer of the interconnect structure disposed above a substrate, the first layer comprising a first grating of alternating metal lines and dielectric lines in a first direction, wherein the dielectric lines have an uppermost surface higher than an uppermost surface of the metal lines; and
   a second layer of the interconnect structure disposed above the first layer of the interconnect structure, the second layer comprising a second grating of alternating metal lines and dielectric lines in a second direction, perpendicular to the first direction, wherein the dielectric lines have a lowermost surface lower than a lowermost surface of the metal lines, wherein the dielectric lines of the second grating overlap and contact, but are distinct from, the dielectric lines of the first grating, and wherein the metal lines of the first grating are spaced apart from the metal lines of the second grating.

2. The interconnect structure of claim 1, further comprising:
   a conductive via disposed between and coupling a metal line of the first grating to a metal line of the second grating, the conductive via directly adjacent to and in a same plane as a portion of a dielectric line of the first grating and a portion of a dielectric line of the second grating.

3. The interconnect structure of claim 2, wherein the conductive via has a center directly aligned with a center of the metal line of the first grating and with a center of the metal line of the second grating.

4. The interconnect structure of claim 1, wherein the dielectric lines of the first grating comprise a first dielectric material, and the dielectric lines of the second grating comprise a second, different dielectric material.

5. The interconnect structure of claim 1, wherein the dielectric lines of the first grating and the dielectric lines of the second grating comprise a same dielectric material.

6. The interconnect structure of claim 1, wherein a metal line of the second grating is disrupted by a plug having a center directly aligned with a center of a dielectric line of the first grating, the plug comprising a first dielectric material, wherein the plug is distinct from, but in contact with, the dielectric line of the first grating and a dielectric line of the second grating.

7. The interconnect structure of claim 6, wherein the dielectric lines of the first grating comprise a second dielectric material, and the dielectric lines of the second grating comprise a third dielectric material, and wherein none of the first dielectric material, the second dielectric material, and the third dielectric material are the same.

8. The interconnect structure of claim 6, wherein the dielectric lines of the first grating comprise a second dielectric material, and the dielectric lines of the second grating comprise a third dielectric material, and wherein two or more of the first dielectric material, the second dielectric material, and the third dielectric material are the same.

9. The interconnect structure of claim 1, further comprising:
   a dielectric region disposed between and in contact with a metal line of the first grating and a metal line of the second grating, the dielectric region directly adjacent to and in a same plane as a portion of a dielectric line of the first grating and a portion of a dielectric line of the second grating.

10. The interconnect structure of claim 9, wherein the dielectric region comprises a first dielectric material, the dielectric lines of the first grating comprise a second dielectric material, and the dielectric lines of the second grating comprise a third dielectric material, and wherein none of the first dielectric material, the second dielectric material, and the third dielectric material are the same.

11. The interconnect structure of claim 9, wherein the dielectric region comprises a first dielectric material, the dielectric lines of the first grating comprise a second dielectric material, and the dielectric lines of the second grating comprise a third dielectric material, and wherein two or more of the first dielectric material, the second dielectric material, and the third dielectric material are the same.

* * * * *